United States Patent

Mundigl et al.

[11] Patent Number: 5,809,633
[45] Date of Patent: Sep. 22, 1998

[54] METHOD FOR PRODUCING A SMART CARD MODULE FOR CONTACTLESS SMART CARDS

[75] Inventors: Josef Mundigl, Duggendorf; Detlef Houdeau, Langquaid, both of Germany

[73] Assignee: Siemens Aktiengesellschaft, Munich, Germany

[21] Appl. No.: 812,111

[22] Filed: Mar. 5, 1997

Related U.S. Application Data

[63] Continuation of PCT/DE95/01201, Sep. 5, 1995, published as WO96/07984, Mar. 14, 1996.

[30] Foreign Application Priority Data

Sep. 5, 1994 [DE] Germany ............. 44 31 605.4

[51] Int. Cl.⁶ ................................................. H02P 11/00
[52] U.S. Cl. ........................... 29/600; 29/827; 235/380; 235/382
[58] Field of Search .................. 29/600, 827; 235/382, 235/380

[56] References Cited

U.S. PATENT DOCUMENTS

| | | |
|---|---|---|
| 4,506,148 | 3/1985 | Berthold et al. . |
| 4,857,893 | 8/1989 | Carroll . |
| 5,308,967 | 5/1994 | Juriseh . |

FOREIGN PATENT DOCUMENTS

| | | |
|---|---|---|
| 0 079 047 A2 | 5/1983 | European Pat. Off. . |
| 37 21 822 C1 | 11/1988 | Germany . |
| 40 19 915 A1 | 1/1992 | Germany . |
| 93/09551 | 5/1993 | WIPO . |
| 93/20537 | 10/1993 | WIPO . |

*Primary Examiner*—Carl J. Arbes
*Attorney, Agent, or Firm*—Herbert L. Lerner; Laurence A. Greenberg

[57] ABSTRACT

A method for producing a smart card module includes bonding one end of a thin wire onto a first contact zone of a semiconductor chip. The wire is guided in a plurality of turns forming an antenna coil. The wire is bonded onto a second contact area of the semiconductor chip. The wire turns of the antenna coil and the semiconductor chip are placed on a carrier body.

3 Claims, 1 Drawing Sheet

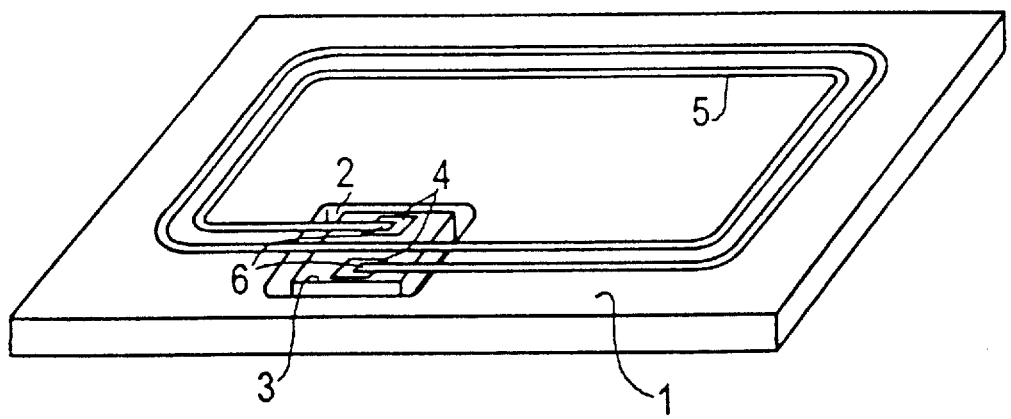

METHOD FOR PRODUCING A SMART CARD MODULE FOR CONTACTLESS SMART CARDS

CROSS-REFERENCE TO RELATED APPLICATION

This application is a Continuation of International Application Serial No. PCT/DE95/01201, filed Sep. 5, 1995 published as WO96/07984, Mar. 14, 1996.

BACKGROUND OF THE INVENTION

Field of the Invention

The invention relates to a method for producing a smart card module.

In the case of contactless smart cards, the power required to operate the semiconductor chip contained in them is supplied through at least one antenna coil, and transformer transmission generally is selected. The data transfer also takes place through that coil.

In that case, not only printed or etched coils or coils grown by electrodeposition in the form of striplines but also wound enamel-insulated wire coils are customary, and copper is used as the basic material for such enamel-insulated wire coils.

In order to connect the coil to the semiconductor chip, the insulation is initially stripped from the connections of the coil, for example through the use of heating, brushing, chemical treatment or tin-coating and then a contact is produced, for example through the use of laser soldering, gap welding, ultrasonic welding, wire-wrap or adhesive bonding with silver enamel adhesive. Therefore, the production of such a connection in each case requires a multiplicity of different work operations and assembly steps, which also require a plurality of machines for their implementation.

German Patent DE 37 21 822 C1 discloses connecting an antenna coil to a semiconductor chip through bonds. Therefore, in the case of that disclosure, a coil must initially be wound and the ends of the coil are then connected to the semiconductor chip through bonds in a further work step.

SUMMARY OF THE INVENTION

It is accordingly an object of the invention to provide a method for producing a smart card module for contactless smart cards, which overcomes the hereinafore-mentioned disadvantages of the heretofore-known devices of this general type and which is simple, cost-effective and can be easily automated.

With the foregoing and other objects in view there is provided, in accordance with the invention, a method for producing a smart card module, which comprises bonding one end of a thin wire onto a first contact zone of a semiconductor chip; guiding the wire, such as with a bonding head, in a plurality of turns forming an antenna coil; bonding the wire onto a second contact area of the semiconductor chip; and placing the wire turns of the antenna coil and the semiconductor chip on a carrier body.

The coil connections are bonded, in an inventive manner, directly onto contact zones of the semiconductor chip. In this case, the bonding device is integrated directly into the wire guiding head of the automatic coil-winding machine, with the result that all of the assembly steps can be carried out using one machine. An aluminum wire is used with particular advantage for the coil. This wire is more than half as light as copper and also has a modulus of elasticity which is only approximately half as large, with the result that the finished card has a lower rigidity. This type of thick-wire bonding is known, for example, in power electronics and is controlled well, with the result that a high yield is achieved.

In accordance with another feature of the invention, the semiconductor chip is disposed in such a manner as to be suspended freely and held only by the bond contacts in a recess in the carrier body, with the result that it is well protected against breakage in the event that the smart card is subjected to bending stress.

Other features which are considered as characteristic for the invention are set forth in the appended claims.

Although the invention is illustrated and described herein as embodied in a method for producing a smart card module for contactless smart cards, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a diagrammatic, perspective view of a possible exemplary embodiment of a smart card module according to the invention.

DESCRIPTION OF THE PREFERRED EMBODIMENTS

Referring now in detail to the single FIGURE of the drawing, there is seen a flat carrier body 1 which is made of flexible, non-conductive material and has a recess 2. A semiconductor chip 3 is inserted into the recess. The semiconductor chip 3 has two contact zones 4 which are enlarged in comparison with the customary chip contact zones through the use of a gold plating, for example. Connections 6 of an antenna coil 5 are secured on the contact zones 4 through the use of bond contacts. The antenna coil 5 is a wire which is advantageously made of aluminum. In this case, the wire has initially been bonded onto one of the contact zones 4, then wound through the use of a guiding head of an automatic wire-winding machine, into which a bonding device is integrated, in a plurality of turns to form the coil (only two turns are illustrated in the FIGURE, but there may also be more) and finally bonded again onto the other contact zone. The semiconductor chip 3 with the coil 5 which is secured thereto in an inventive manner is subsequently inserted into the recess 2 in the carrier body 1, with the result that the coil 5 is disposed on the carrier body 1. In this case, the carrier body 1 can have the length and width of a finished smart card, with the result that the smart card can be completed merely through the use of corresponding coverings on the carrier body. However, the carrier body 1 may also have smaller dimensions than a smart card, with the result that it can be inserted as an inlet or insert into a center section of the smart card which is in the form of a frame.

We claim:

1. A method for producing a smart card module, which comprises:

bonding one end of a thin wire onto a first contact zone of a semiconductor chip;

guiding the wire in a plurality of turns forming an antenna coil;

bonding the wire onto a second contact area of the semiconductor chip; and placing the wire turns of the antenna coil and the semiconductor chip on a carrier body.

2. The method according to claim 1, which comprises performing the guiding step with a bonding head.

3. The method according to claim 1, which comprises placing the semiconductor chip in a recess in the carrier body and suspending the semiconductor chip from bonds at the ends of the wire, while carrying out the step of placing the wire turns of the antenna coil and the semiconductor chip on the carrier body.

* * * * *